United States Patent [19]
Viljoen et al.

[11] Patent Number: 6,057,628
[45] Date of Patent: May 2, 2000

[54] PIEZOELECTRIC SENSORS/ACTUATORS FOR USE IN REFRACTORY ENVIRONMENTS

[75] Inventors: Hendrik J. Viljoen; Barend R. Jooste, both of Lincoln, Nebr.

[73] Assignee: Board of Regents of the University of Nebraska, Lincoln, Nebr.

[21] Appl. No.: 09/110,286

[22] Filed: Jul. 6, 1998

Related U.S. Application Data

[60] Provisional application No. 60/067,001, Dec. 1, 1997.

[51] Int. Cl.[7] .................................................. H01L 41/04
[52] U.S. Cl. ............................................................ 310/311
[58] Field of Search .................................... 310/311, 360, 310/361, 313 A

[56] References Cited

U.S. PATENT DOCUMENTS

| | | | |
|---|---|---|---|
| 3,727,084 | 4/1973 | Epstein | 310/9.5 |
| 4,358,882 | 11/1982 | Wilkinson | 29/156.8 |
| 4,617,487 | 10/1986 | Sone et al. | 310/313 |
| 4,712,036 | 12/1987 | Gürich | 310/333 |
| 4,767,719 | 8/1988 | Finlan | 436/501 |
| 4,893,049 | 1/1990 | Bundy et al. | 29/156.8 |
| 4,927,299 | 5/1990 | Ramalingam et al. | 407/120 |
| 4,927,300 | 5/1990 | Ramalingam et al. | 407/120 |
| 5,195,046 | 3/1993 | Gerardi et al. | 364/506 |

OTHER PUBLICATIONS a. An article by Wicker et al, titled "*Linear and Non–Linear Pressure Oscillations In Baffled Combustion Chambers*", J. of Sound and Vibration 184(1), (1995).

b. An article by Barrett et al, titled "*Active Vibration Control Of Rotating Machinery Using Piezoelectric Actuators Incorporating Flexible Casing Effects*", Trans. of the ASME, vol. 117, (Jan., 1995).

c. An article by Sujith et al, titled "*An Exact Solution For One–Dimensional Acoustic Fields In Ducts With An Axial Temperature Gradient*", J. of Sound and Vibration, 184(3), (1995).

d. An article by Gadzhiev et al, titled "*Robotic Diagnostic Device Using High–Temperature Piezoelectric Transducers*", Izmeritel'naya Tek., No. 9, (Sep. 1993).

e. An article by Rokhlin et al, titled "*Assessment of Damage in Ceramics and Ceramic Matrix Composites Using Ultrasonic Techniques*", J. Eng. for Gas Turbines and Power, vol. 117, (Jul. 1995).

f. An article by Perrissin–Fabert et al, titled "*Simulated And Experimental Study Of The Electrical Impedance Of A Piezoelectric Element In A Viscoelestic Medium*", Ultrasonics, vol. 32, No. 2, (1994).

g. An article by Guoping et al. titled "*Structures And Properties Of A Ta2O5 Thin Film Deposited By D.C. Magnetron Reactive Sputtering In A Pure O2 Atmosphere*", Vacuum, Vo. 41, Nos. 4–6, (1990).

h. An article by Tominaga et al. titled "*Preparation of (111)–Oriented β–Ta2O5 Thin Films By Chemical Vapor Deposition Using Metalorganic Precursors*", J. Appl. Phys. vol. 31 (May 1992).

i. Graham and Stinton, in an article titled "*Development of Tantalum Pentoxide Coatings by Chemical Vapor Deposition*", J. Am. Ceram. Soc. 77(9), (1994).

j. Moon et al., in an article titled "*Effects of Deposition Temperature on Dielectric Properties of PECVD Ta2O5 Thin Film*", J. of Materials Sci., 29, (1994).

(List continued on next page.)

*Primary Examiner*—Mark O. Budd
*Attorney, Agent, or Firm*—James D. Welch

[57] ABSTRACT

Disclosed is a piezoelectric system which demonstrates piezoelectric properties over a large temperature range of from room temperature to approximately 1360 degrees centigrade. The piezoelectric system is sequentially comprised of a first electrically conductive layer, a layer of ($Ta_2O_5$) in other than a monoclinic phase, (preferably orthorhombic demonstrating small x-ray crystalographic <0 0 1> and <1 11 0> peaks), and a second electrically conductive layer. A preferred method of fabrication involves sputter deposition of both said layer of ($Ta_2O_5$) and said second electrically conductive layer.

10 Claims, 5 Drawing Sheets

OTHER PUBLICATIONS k. An article by Nakagawa et al. titled "*Material Constants of New Piezoelectric Ta2O5 Thin Films*", J. App. Phys. 68(2), 556, (Jul. 1990).

l. An article by Jehn et al. titled "*High Temperature Solid Solubility Limit and Phase Studies in the System Tantalum–Oxygen*", J. of The Less Common Metals, 27, (1972).

m. An article by Shimizu et al., in an article titled "*Microcrystalinity in X–ray amorphous anodic Ta2O5*", Philosophical Magazine B, Vo. 63, 891, (1991).

n. An article by Pignolet et al., in an article titled "*Rapid Thermal Processed Thin Films Of Reactively Sputtered Ta2O5*", Thin Film Solids 285, 230, (1995).

o. An article by Shimizu et al, "*Stoichiometry Measurement and Electric Cgaracteristics of Thin Film Ta2O5 Insulator for Ultra–Large– Scale Integration*", J. App. Phys. 74(1), (Jul. 1993).

p. An article by Han et al. "*Effects Of Post–Deposition Annealing On The Electrical Properties And Reliability Of Ultrathin Chemical Vapor Deposited Ta2O5 Films*", IEEE Electron Devices Lett. vol. 15, No. 8, (Aug. 1994).

q. An article by Shinriki et al. "*Two–Step Annealing Technique for Leakage Current Reduction in Chemical–Vapor–Deposited Ta2O5 Films*" IEEE Electron Device Letters, vol. 10, No. 11, (Nov. 1989).

r. An article by Treichel et al, "*Low–Pressure Chemical Vapor Deposition Of Tantalum Pentoxide Films For VLSI Devices Using Tantalum Pentaethoxide As A Precursor*", Adv. Mat. for Optics and Electronics, vol. 1, (1992).

s. An article by Nakagawa and Okada, in an article titled "*Material Constants of New Piezoelectric Ta2O5 Thin Films*", J. Appl. Phys. 68(2), (Jul. 1990).

t. An article by Maeda et al. reported results of impedance analysis in an article titled "*An Automated System for Measuring Elastic Properties by the Piezoelectric Resonance Method and its Applications to Elastic Phase Transisitions*", Japanese J. of App. Phys. vol. 30, No. 9B, (Sep. 1991).

u. An article by Nakagawa and Gomi in an article titled "*New Piezoelectric Ta2O5 Thin Films*", Appl. Phys. Lett. 46, 139, (Jan. 1985).

v. An article by the inventors of the present invention, which was published after ther priority date of this Patent Disclosure, is titled "*A Study of Piezoelectric Orthorhombic Ta2O5*", and appeared in the J. Mater. Res., vol. 13, No. 2, Feb. 1998.

w. "*Refractory Materials*", Section titled "*High Temperature Oxides, Part II, Oxides of Rare Earths, Titanium, Zirconium, Hafnium, Niobium and Tantalum*", Edited by Alper, Academic Press, (1970).

x. An article by Lee et al. titled "*Nondescructive and Quantative Depth profiling Analysis of Ion Bombarded Ta2O5 Surfaces by Medium Energy Ion Scattering Spectroscopy*", Vac. Sci. Technol. A vol. 13, No. 3 (1995).

y. An article by Roberts et al., titled "*Selective Studies of Crystalline Ta2O5 Films*", J. of Electrochemical Soc., vol. 133, No. 7, (Jul. 1986).

z. An article by Roth et al., titled "*Effect of Oxide Additions on Polymorphism of Tantalum Pentoxide. IV The System of Ta2O5–Ta2WO8*", J. Solid State Chem., 2 (1970).

aa. An article by Seki et al., titled "*Electrical Characteristics of the RF Magnetron–Sputtered Tantalum Pentoxide–Silicon Interface*", J. Electrochem. Soc., Solid State Science & Technology, vol. 131, No. 11, (Nov. 1984).

bb. An article by Seki et al., titled "*Formation of High–Quality, Magnetron–Sputtered Ta2O5 Films by Controlling the Transition Region at the Ta2O5/Si Interface*", J. Vac. Sci. A 5(4), (Jul./Aug. 1987).

cc. An article by Stephenson et al., titled "*The Crystal Structure of the High Temperature Form of Ta2O5*", J. Solid State Chem., 3, (1971).

dd. An article by Shibata titled "*Dielectric Constants of Ta2O5 Thin Films Deposited by R.F. Sputtering*", Thin Solid Films, 277 (1996).

ee. An article by Vireton et al., titled "*SiO2–Ta2O5 Sputtering Yields: Simulated and Experimental Results*", Nuc. Instrum. and Methods in Phys. Res., B 95 (1995).

ff. An article by Williams et al., titled "*An Electron and X–Ray Diffraction Study of L–Ta2O5–Type Phases in L–Ta2O5 and Some L–Ta2O5–MaOb Systems: (M=A1, Ti, Zr, Hf, W)*", J. Solid State Chem., 92 (1991).

gg. An article by Moon titled "*Erratum—Effect of Deposition Temperature on Dielectric Properties of PECVD Ta2O5 Thin Films*", IEEE Trans. Electron. Device ED–29 (1982).

hh. An article by An et al., titled "*Ellipsometric Examination of Structure and Growth Rate of Metallorganic Chemical Vapor Deposited Ta2O5 Films on Si (100)*", J. Electrochem. Soc. vol. 141, No. 3, (Mar. 1994).

ii. An article by Atanassova et al., titled "*AES and XPS Study of Thin RF–Sputtered Ta2O5 Layers*", App. Surface Sci., 84 (1995).

jj. An article by Atanassova et al. titled "*Elemental Composition and Structural Properties of Thin RF Sputtred Ta2O5 Layers*", Vacuum, vol. 46, No. 8–10 (1995).

kk. An article by Bousse et al. titled "*Zeta Potential Measurements of Ta2O5 and SiO2 Thin Films*", J. of Colloid and Interface Sci., vol. 147, No. 1 (Nov. 1991).

ll. An article by Burte et al., titled "*Low Pressure Chemical Vapour Deposition of Tantalum Pentoxide Thin Layers*", J. of Non–Crystaline Solids, 187, (1995).

mm. An article by Heng et al., titled "*Structures of Tantalum pentoxide Thin Flms Formed by Reactive Sputtering of Ta Metal*", Thin Solid Films 258, (1995).

nn. An article by Gurtler et al., titled "*Characterization of Ta2O5 Layers by Electron Spectroscopy for Chemical Analysis Rutherford Backscattering Spectroscopy, Nuclear Reaction Analysis and Optical Methods*", Thin Solid Films, 175, (1989).

oo. An article by Harburn et al., titled "*The Crystal Chemistry of Non–Stoichiometric Oxides With the Low–Temperature Ta2O5 Structure*", Phil Mag. A, vol. 68, No. 4, (1993).

pp. An article by Ghanim et al., titled "*Optical Properties of Tantalum Pentoxide Coatings Deposited Using Ion Beam Processes*", Thin Solid Films, 209, (1992).

qq. An article by Pawel et al., titled "*Electron Microscope Observation of the Crystallization of Anodically Formed Tantalum and Niobium Oxide Films*", J. Electrochem Soc., vol. 111, No. 11, (Nov. 1964).

rr. An article by Khanin et al., titled "*The Influence of Structural Defects on the Electronic Properties of Amorphous Ta2O5*", Phys. Stat. Sol. (b) 174 (1992).

ss. An article by Knausenberger et al., titled "*Selected Properties of Pyrolitic Ta2O5 Films*", J. Electrochem Soc., vol. 120, No. 7, (1973).

tt. An article by Lo et al., titled "*Metal–Oxide–Semiconductor Characteristics of Chemical Vapor Deposited Ta2O5 Films*", App. Phys. Lett., V 60, No. 26., (1992).

uu. An article by Zhang et al., titled "*Analysis of Ta2O5–Ta Interface*", Vacuum, vol. 41, No. 7–9, (1990).

vv. An article by Malherbe et al., titled *"Preferential Sputtering of Oxides: A Comparison of Model Predictions With Experimental Data"*, App. Surface Sci., 27, (1986).

ww. An article by Montero et al., titled *"Space Charge and Electret Behaviour in Anodic Ta2O5 Films"*, Thin Solid Films, 167, (1988).

xx. An article by Moon et al., titled *"Sputter Depth Profiling Analysis of Ta2O5 on Si Without Prefernetial Sputtering by Energetic Oxygen Beams"*, App. Phys. Lett. 62, (24) (Jun. 1993).

yy. An article by Murawala et al., titled *"Liquid Source CVD Using Penta Ethoxy Tantalum Source"*, Jap. J. of vol. 32 (1995).

zz. An article by Murti et al., titled *"Structural and Compositional Changes in Ion–Bombarded Ta2O5"*, Surface Sci., 81, (1979).

aaa. An article by Ohnishi et al., titled *"Ta2O5 Film Formation by Double Ion Beam Method"*, Nuc. Instrum. and Methods in Phys. Research, B37 (1989).

bbb. An article by Kamiyama et al., titled *"Ultrathin Tantalum Oxide Capacitor Dielectric Layers Fabricated Using Rapid Thermal Nitridation Prior to Low Pressure Chemical Vapor Deposition"*, J. Electrochem. Soc. vol. 140, No. 6 (Jun. 1993).

ccc. An article by Zaima titled *"Preparation and Properties of Ta2O5 Films by LPCVD for ULSI Application"*, J. of the Electrochem Soc., vol. 37, No. 4 (Apr. 1990).

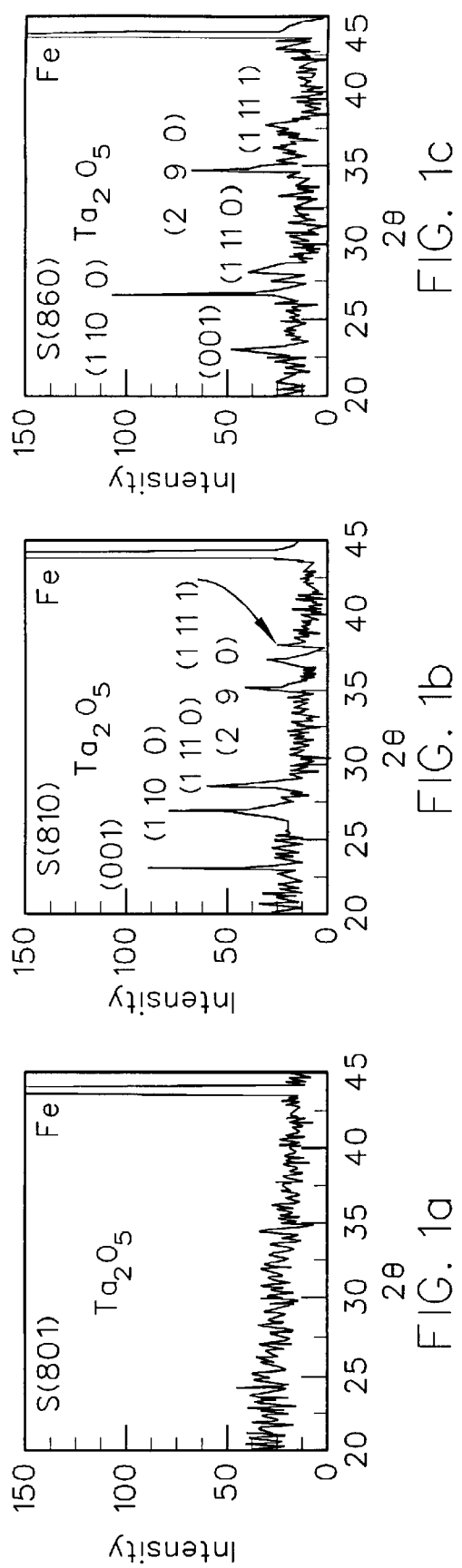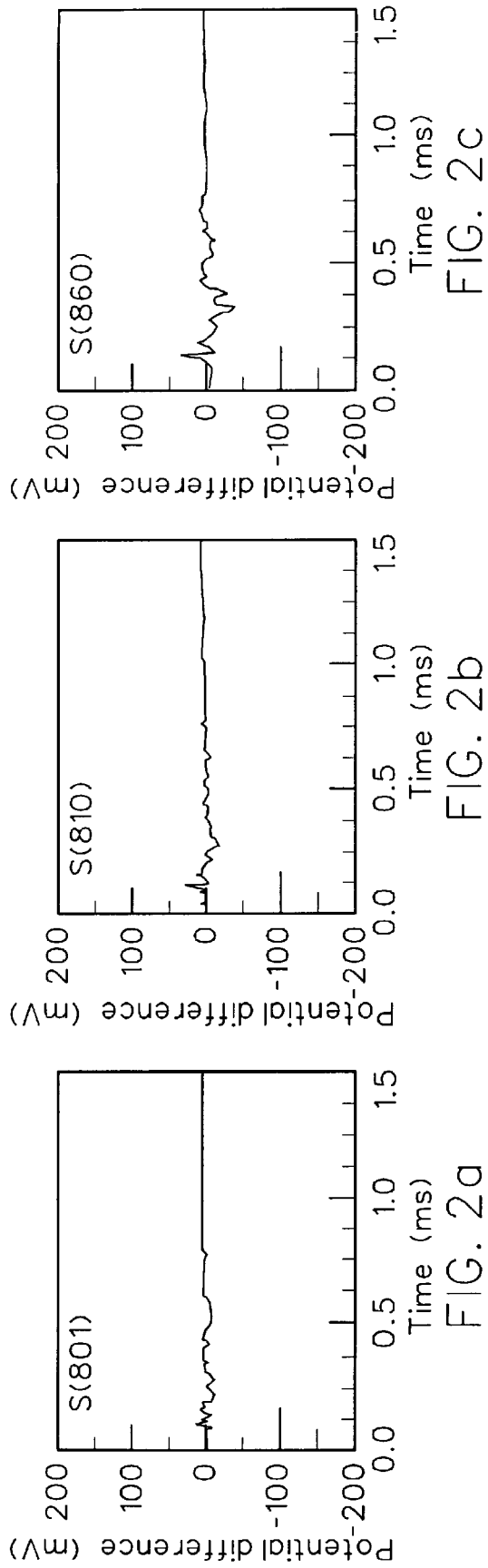

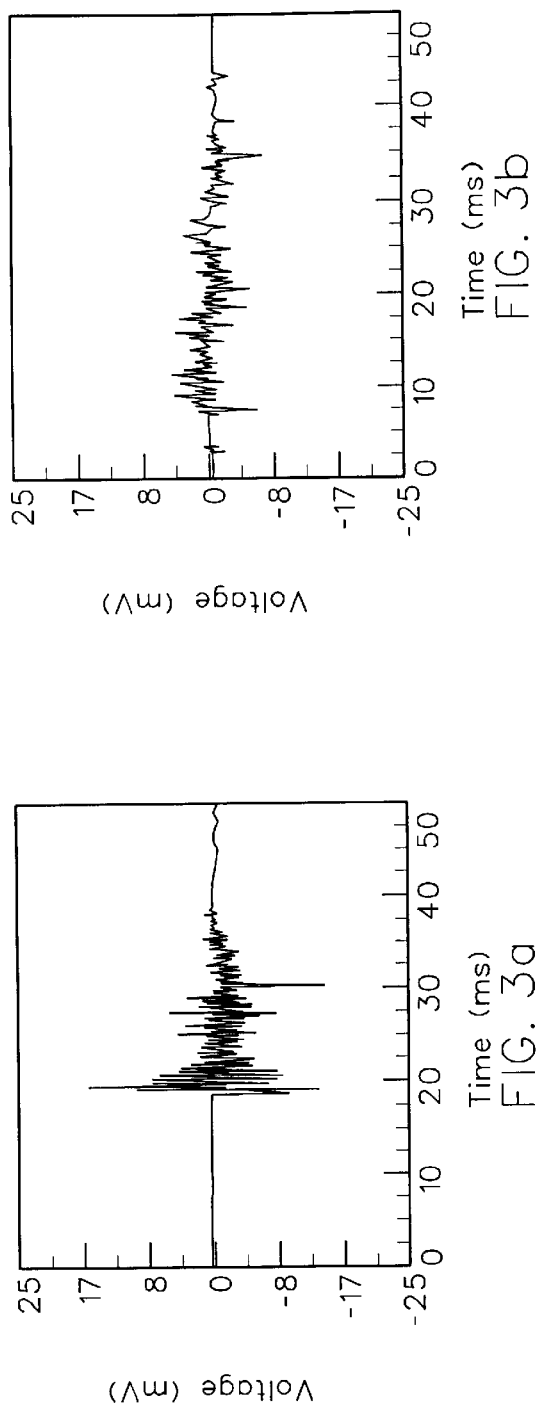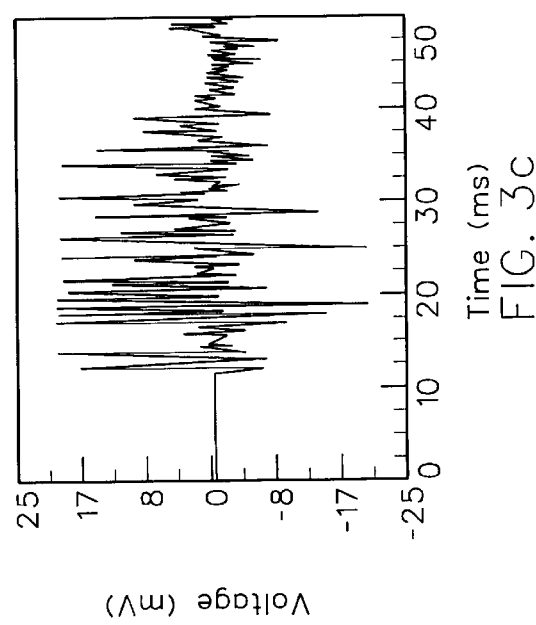

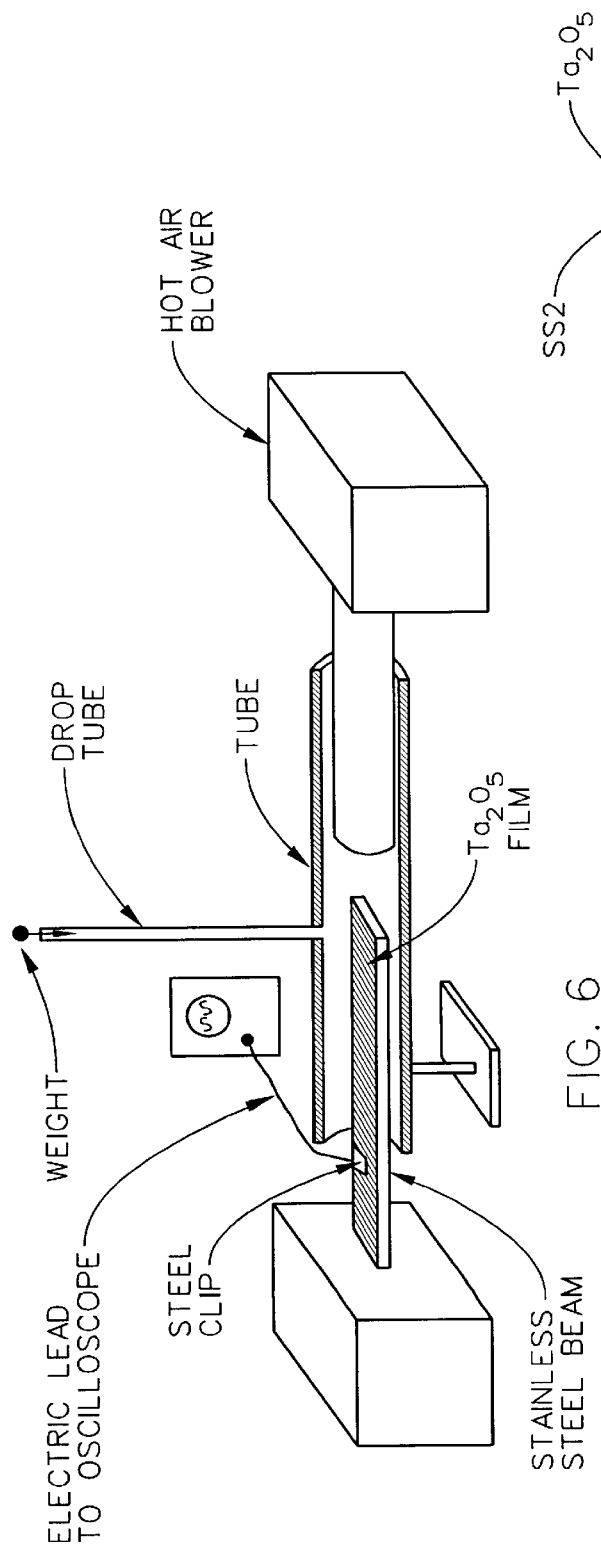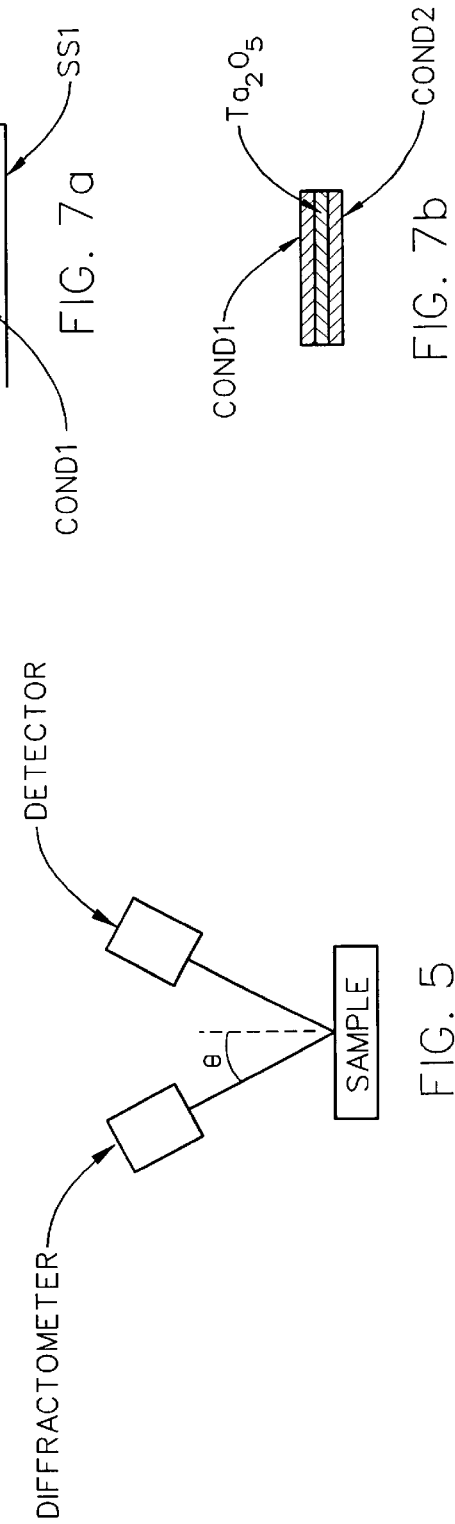

PIEZOELECTRIC SENSORS/ACTUATORS FOR USE IN REFRACTORY ENVIRONMENTS

This application claims benefit of Provisional Application No. 60/067,001 filed Dec. 1, 1997.

TECHNICAL FIELD

The present invention relates to piezoelectric sensors and actuators, and more particularly to $Ta_2O_5$, (in other than a monoclinic phase), piezoelectric sensors and actuators which reliably operate in high temperature, oxidizing, and otherwise refractory environments.

BACKGROUND

Piezoelectric sensors and actuators are utilized extensively as transducers, and in non-destructive testing of structures and materials, in non-refractory environments. To date, however, reliable piezoelectric sensors and actuators which are suitable to use in high temperature, oxidizing and other refractory, (eg. combustion environments), environments have not been generally available. Articles which identify candidate applications for a piezoelectric system which can be applied in refractory environments are:

a. An article by Wicker et al, titled "Linear and Non-Linear Pressure Oscillations In Baffled Combustion Chambers", J. of Sound and Vibration 184(1), (1995) discusses measurement of flow and combustion induced vibrations in experimental turbines or combustion housings of propulsion systems;

b. An article by Barrett et al, titled "Active Vibration Control Of Rotating Machinery Using Piezoelectric Actuators Incorporating Flexible Casing Effects", Trans. of the ASME, Vol. 117, (January, 1995) which discusses using piezoelectric films as actuators placed on baffles, blades or combustion housings in control of vibrations in turbine engines;

c. An article by Sujith et al, titled "An Exact Solution For One-Dimensional Acoustic Fields In Ducts With An Axial Temperature Gradient", J. of Sound and Vibration, 184(3), (1995) which discusses measurement of combustion-driven acoustic perturbations in gas phase, downstream of a reaction zone. Piezoelectric sensors would provide utility in the form of allowing the monitoring of induced acoustic perturbations which impact combustion stabilities in the gas phase, and which cause vibrations in solid structures. It is disclosed in said Sijith paper that feedback between acoustic field and chemical reaction can cause a state of oscillatory or chaotic combustion to develop;

d. An article by Gadzhiev et al, titled "Robotic Diagnostic Device Using High-Temperature Piezoelectric Transducers", Izmeritel'naya Tek., No. 9, (September 1993), which discusses ultra-sonic inspection of high temperature structures such as found in nuclear power plants. It is noted that most said applications presently utilize ferroelectrics which operate only below their Curie temperature;

e. An article by Rokhlin et al, titled "Assessment of Damage in Ceramics and Ceramic Matrix Composites Using Ultrasonic Techniques", J. Eng. for Gas Turbines and Power, Vol. 117, (July 1995), which discusses embedding of sensor into green bodies, pre-forms and concrete structures to provide structural information during densification and hardening processes and during regular service;

f. An article by Perrissin-Fabert et al, titled "Simulated And Experimental Study Of The Electrical Impedance Of A Piezoelectric Element In A Viscoelestic Medium", Ultrasonics, Vol. 32, No. 2, (1994) provides insight that piezoelectric devices can compete with microelectronics utilized in cure-monitoring.

Other envisioned applications include monitoring machine tool cutting element temperature during use, and in development of signals utilized in damping out vibrations which develop during material machining.

It is noted that Scientific literature reporting materials which demonstrate a piezoelectric at high temperatures is practically non-existent. However, a search for materials which demonstrate piezoelectricity and which might be adaptable to use in refractory environments has identified, as a non-limiting candidate, Tantulum-Pentoxide $Ta_2O_5$. Said material, in addition to, (in certain phase and crystallographic orientations), demonstrating piezoelectricity, presents with a high dielectric constant and has good insulating properties.

Scientific literature regarding deposition of films includes insight to deposition techniques, (eg. MOCVD, PECVD, Annodizing, RF and DC Sputtering), the effects of substrate-type upon which a film is deposited, and the effects of annealing deposited films. In particular, the properties of deposited $Ta_2O_5$ films are very dependent upon starting substrate, deposition technique and annealing etc.

An article by Guoping et al. titled "Structures And Properties Of A $Ta_2O_5$ Thin Film Deposited By D. C. Magnetron Reactive Sputtering In A Pure $O_2$ Atmosphere", Vacuum, Vo. 41, Nos. 4–6, (1990), describes the use of reactive sputtering of $Ta_2O_5$ films onto Silicon, Graphite and Fused Quartz substrate held at four-hundred (400) degrees Centigrade, and reported a primarily <200> orientation resulted.

An article by Tominaga et al. titled "Preparation of (111)-Oriented $\beta$-$Ta_2O_5$ Thin Films By Chemical Vapor Deposition Using Metalorganic Precursors", J. Appl. Phys. Vol. 31 (May 1992) describes deposition of $Ta_2O_5$ films onto <100> Silicon and Quartz by LPCVD with the substrate held between six-hundred (600) and seven-hundred (700) degrees Centigrade at five (5) Torr. Tominaga et al. reported that below (600) degrees Centigrade achieved films were amorphous, and that between (625) and (675) degrees Centigrade the dominate achieved crystallographic orientation was <111>. At higher temperatures the <110> orientation became dominate with smaller peaks of <020>, <021> and <112> being observable.

Graham and Stinton, in an article titled "Development of Tantalum Pentoxide Coatings by Chemical Vapor Deposition", J. Am. Ceram. Soc. 77(9), (1994) reported using CVD to apply corrosion protective coatings of $Ta_2O_5$ onto SiC substrates. Deposition temperatures utilized were between (1200) and (1300) degrees Centigrade and achieved film structure was reported as polycrystalline $\beta$-$Ta_2O_5$.

That the orientation of deposited $Ta_2O_5$ films is sensitive to deposition conditions, precursors and substrate materials is reported in various articles. For instance, Moon et al., in an article titled "Effects of Deposition Temperature on Dielectric Properties of PECVD $Ta_2O_5$ Thin Film", J. of Materials Sci., 29, (1994), reported using TaCl as a precursor in a PECVD deposition process and reported finding a $\delta$-$Ta_2O_5$ phase film after a one (1) hour anneal at seven-hundred (700) degrees Centigrade.

The article by Tominaga et al., already cited, reports that achieved crystal orientation of $Ta_2O_5$ films was dependent upon precursor utilized. When pentaethoxytantalum was used both <110> and <111> orientations formed at substrate temperatures above (625) degrees Centigrade. The use of tantalum chloro-tetradipivaloymethane promoted formation of <111) crystallographic orientation.

An article by Nakagawa et al. titled "Material Constants of New Piezoelectric $Ta_2O_5$ Thin Films", J. App. Phys. 68(2), 556, (July 1990) reports that magnetron sputtering deposition of $Ta_2O_5$ produces a <200> crystallographic orientation which demonstrates piezoelectric characteristics. While it is not understood why, it is noted that CVD deposition of $Ta_2O_5$ seems to favor <111> crystallographic orientation, while Sputter deposition seems to favor <200> crystallographic orientation.

An article by Jehn et al. titled "High Temperature Solid Solubility Limit and Phase Studies in the System Tantalum-Oxygen", J. of The Less Common Metals, 27, (1972), is also identified as it presents a phase diagram for $Ta_2O_5$ over a range of temperatures between 1100–2500 degrees Centigrade. Said phase diagram shows that a low temperature form orthorhombic $Ta_2O_5$ transforms to a monoclinic β phase at 1360 degrees Centigrade. The transformation is sluggish and exists metastably until the melting point of the β-phase at 1785 degrees Centigrade. This shows that a very stable orthorhombic β-$Ta_2O_5$ phase sensor/actuator should be possible over a large temperature range, (eg. room temperature to 1365 degrees Centigrade), if said orthorhombic β-$Ta_2O_5$ is piezoelectric.

It is noted at this point, that the present invention is founded in the fact that identifiable crystallographic orientations of orthorhombic $Ta_2O_5$ do show piezoelectric properties, and that certain definite fabrication procedure steps allow repeatedly achieving orthorhombic $Ta_2O_5$ which demonstrate piezoelectric properties.

It is also noted that Sputter deposition of $Ta_2O_5$ films provides an advantage in carbon contamination control. CVD deposition involves decomposition products of organo-metallic precursors which can cause hydrocarbon or pryolitic carbon contamination of deposited films. Where Sputtering is utilized the source of carbon contamination is limited to pumping and cleaning fluids and hydrocarbons present on a substrate prior to film deposition.

The effects of annealing deposited $Ta_2O_5$ films have been reported by various authors. While it is generally accepted that amorphous films, exclusively, are deposited on substrates which are not externally heated during deposition, Shimizu et al., in an article titled "Microcrystalinity in 'X-ray amorphous anodic $Ta_2O_5$", Philosophical Magazine B, Vo. 63, 891, (1991) reported use of microdiffraction to obtain insight to films considered as amorphous by conventional X-ray Diffraction (XRD) techniques. Microcrystalline structures were found which were a few nanometers in size. Pignolet et al., in an article titled "Rapid Thermal Processed Thin Films Of Reactively Sputtered $Ta_2O_5$", Thin Film Solids 285, 230, (1995) reported use of rapid thermal annealing of $Ta_2O_5$ films to improve dielectric permittivity. Several authors have proposed a two-step annealing process to reduce contamination and improve stoichiometry. (See Shimizu et al, "Stoichiometry Measurement and Electric Characteristics of Thin Film $Ta_2O_5$ Insulator for Ultra-Large-Scale Integration", J. App. Phys. 74(1), (July 1993); and Han et al. "Effects Of Post-Deposition Annealing On The Electrical Properties And Reliability Of Ultrathin Chemical Vapor Deposited $Ta_2O_5$ Films", IEEE Electron Devices Lett. Vol. 15, No. 8, (August 1994); and Shinriki et al. "Two-Step Annealing Technique for Leakage Current Reduction in Chemical-Vapor-Deposited $Ta_2O_5$ Films" IEEE Electron Device Letters, Vol. 10, No. 11, (November 1989); and Treichel et al, "Low-Pressure Chemical Vapor Deposition Of Tantalum Pentoxide Films For ULSI Devices Using Tantalum Pentaethoxide As A Precursor", Adv. Mat. for Optics and Electronics, Vol. 1, (1992).

It is also noted that Nakagawa and Okada, in an article titled "Material Constants of New Piezoelectric $Ta_2O_5$ Thin Films", J. Appl. Phys. 68(2), (July 1990), described piezoelectric properties of Monoclinic $Ta_2O_5$. Described impedance measurements and bulk wave speed measurements provided information required to calculate the dielectric, piezoelectric and stiffness constants. Results of the impedance analysis of Maeda et al. reported in an article titled "An Automated System for Measuring Elastic Properties by the Piezoelectric Resonance Method and its Applications to Elastic Phase Transisitions", Japanese J. of App. Phys; Vol. 30, No. 9B, (September 1991), were in agreement with work reported by earlier investigators, Nakagawa and Gomi in an article titled "New Piezoelectric $Ta_2O_5$ Thin Films", Appl. Phys. Lett. 46, 139, (January 1985), who found that electromechanical coupling was comparable to that of ZnO <002> at room temperature.

An article by the inventors of the present invention, which was published after the priority date of this Patent Disclosure, is titled "A Study of Piezoelectric Orthorhombic $Ta_2O_5$", and appeared in the J. Mater. Res., Vol. 13, No. 2, February 1998. This paper describes the piezoelectric properties of orthorhombic $Ta_2O_5$ and to some extent overlaps the material in this Patent Disclosure.

It is noted that to date most investigation into acoustic sensors which operate at elevated temperatures has been focused upon Ferroelectric materials, and it is noted that except for Lithium Niobate, said materials are operable only below the Curie Temperature, (eg. only up to approximately 300 to 400 degrees Centigrade).

A search of Patents which describe piezoelectric systems which can be operated in refractory environments, and methods of fabrication thereof, provided very little. Particular effort was made to identify piezoelectric systems which are comprised of tantalum pentoxide ($Ta_2O_5$), but only two Patents made specific reference thereto. One is a Patent to Finlan, U.S. Pat. No. 4,767,719 which describes use of piezoelectric systems in surface acoustic wave (SAW) devices applied in chemical assay systems. Said 719 Patent briefly mentions that where piezoelectric materials are sputter deposited, $Ta_2O_5$ may be a suitable choice of material. A Patent to Sone et al., U.S. Pat. No. 4,617,487 describes piezoelectric elastic surface wave grill-shaped electrode in which $Ta_2O_5$ is applied as an insulator to minimize degradation of properties suffered by conventional elastic surface wave elements. Identified Patents which describe use of lithium niobate as piezoelectric material in high temperature or explosion environments were U.S. Pat. Nos. 3,727,084 to Epstein; 4,712,036 to Gurich; and 4,893,049. The application of transducers in turbine blades is described in U.S. Pat. No. 4,358,882 to Wilkinson and the use of piezoelectric materials in monitoring structural integrity in aircraft, spacecraft, buildings, ships underwater vehicles, tanks, dams and bridges is described in U.S. Pat. No. 5,195,046 to Gerardi et al. The most relevant result of the Search for Patents is that very little prior art was found which mentions $Ta_2O_5$, and in particular no identified Patent describes specific piezoelectric properties of tantalum pentoxide.

Additional Patents of which the inventors are aware, which focus upon application of piezoelectric materials in machine elements and high speed steel, carbide and ceramic cutting tools are U.S. Pat. Nos. 4,927,299 and 4,927,300 to Ramalingam et al.

References published by, or which will be published by the present Inventors are:

"A Study Of $Ta_2O_5$ For Use As High Temperature Piezo-electric Sensors", Jooste & Viljoen, J. of Mat. Res. Soc. Symp. Vol. 459 (1997), and "The Design of a Piezoelectric Based Sensor for Applications at High Temperatures", Jooste & Viljoen, (To Be Published), and "A study of $Ta_2O_5$ For Use As High Temperature Piezo-electric Sensors", Jooste & Viljoen, (To Be Published).

Additional references of which the inventors are aware, and which are disclosed for general purposes are:

"Refractory Materials", Section titled "High Temperature Oxides, Part II, Oxides of Rare Earths, Titanium, Zirconium, Hafnium, Niobium and Tantalum", Edited by Alper, Academic Press, (1970).

An Article by Lee et al., titled "Nondescructive and Quantative Depth profiling Analysis of Ion Bombarded $Ta_2O_5$ Surfaces by Medium Energy Ion Scattering Spectroscopy", Vac. Sci. Technol. A Vol 13, No. 3 (1995).

An Article by Roberts et al., titled "Selective Studies of Crystaline $Ta_2O_5$ Films", J. of Electrochemical Soc., Vol 133, NO. 7, (July 1986).

An article by Roth et al., titled "Effect of Oxide Additions on Polymorphism of Tantalum Pentoxide. IV The System of $Ta_2O_5$-$Ta_2WO_8$", J. Solid State Chem., 2 (1970).

An article by Seki et al., titled "Electrical Characteristics of the RF Magnetron-Sputtered Tantalum Pentoxide-Silicon Interface", J. Electrochem. Soc., Solid State Science & Technology, Vol. 131, No. 11, (November 1984).

An article by Seki et al., titled "Formation of High-Quality, Magnetron-Sputtered $Ta_2O_5$ Films by Controlling the Transition Region at the $Ta_2O_5$/Si Interface", J. Vac. Sci. A 5(4), (July/August 1987).

An article by Stephenson et al., titled "The Crystal Structure of the High Temperature Form of $Ta_2O_5$", J. Solid State Chem., 3, (1971).

An article by Shibata titled "Dielectric Constants of $Ta_2O_5$ Thin Films Deposited by R.F. Sputtering", Thin Solid Films, 277 (1996).

An article by Vireton et al., titled "$SiO_2$-$Ta_2O_5$ Sputtering Yields: Simulated and Experimental Results", Nuc. Instrum. and Methods in Phys. Res., B 95 (1995).

An article by Williams et al., titled "An Electron and X-Ray Diffraction Study of L-$Ta_2O_5$-Type Phases in L-$Ta_2O_5$ and Some L-$Ta_2O_5$-$M_aO_b$ Systems: (M=Al, Ti, Zr, Hf, W)", J. Solid State Chem., 92 (1991).

An article by Moon titled "Erratum—Effect of Deposition Temperature on Dielectric Properties of PECVD $Ta_2O_5$ Thin Films", IEEE Trans. Electron. Device ED-29 (1982).

An article by An et al., titled "Ellipsometric Examination of Structure and Growth Rate of Metalorganic Chemical Vapor Deposited $Ta_2O_5$ Films on Si (100)", J. Electrochem. Soc. Vol. 141, No. 3, (March 1994).

An article by Atanassova et al., titled "AES and XPS Study of Thin RF-Sputtered $Ta_2O_5$ Layers", App. Surface Sci., 84 (1995).

An article by Atanassova et al. titled "Elemental Composition and Structural Properties of Thin RF Sputtred $Ta_2O_5$ Layers", Vacuum, Vol. 46, No. 8–10 (1995).

An article by Bousse et al. titled "Zeta Potential Measurements of $Ta_2O_5$ and SiO Thin Films", J. of Colloid and Interface Sci., Vol. 147, No. 1 (November 1991).

An article by Burte et al., titled "Low Pressure Chemical Vapour Deposition of Tantalum Pentoxide Thin Layers", J. of Non-Crystaline Solids, 187, (1995).

An article by Heng et al., titled "Structures of Tantalum pentoxide Thin Flms Formed by Reactive Sputtering of Ta Metal", Thin Solid Films 258, (1995).

An article by Gurtler et al., titled "Characterization of $Ta_2O_5$ Layers by Electron Spectroscopy for Chemical Analysis Rutherford Backscattering Spectroscopy, Nuclear Reaction Analysis and Optical Methods", Thin Solid Films, 175, (1989).

An article by Harburn et al., titled "The Crystal Chemistry of Non-Stoichiometric Oxides With the Low-Temperature $Ta_2O_5$ Structure", Phil Mag. A, Vol. 68, No. 4, (1993).

An article by Ghanim et al., titled "Optical Properties of Tantalum Pentoxide Coatings Deposited Using Ion Beam Processes", Thin Solid Films, 209, (1992).

An article by Pawel et al., titled "Electron Microscope Observations of the Crystallization of Anodically Formed Tantalum and Niobium Oxide Films", J. Electrochem Soc., Vol. 111, No. 11, (November 1964).

An article by Khanin et al., titled "The Influence of Structural Defects on the Electronic Properties of Amorphous $Ta_2O_5$, Phys. Stat. Sol. (b) 174 (1992).

An article by Knausenberger et al., titled Selected Properties of Pyrolitic $Ta_2O_5$ Films", J. Electrochem Soc., Vol. 120, No. 7, (1973).

An article by Lo et al., titled "Metal-Oxide-Semiconductor Characteristics of Chemical Vapor Deposited $Ta_2O_5$ Films", App. Phys. Lett., V 60, No. 26., (1992).

An article by Zhang et al., titled "Anaylsis of $Ta_2O_5$-Ta Interface", Vacuum, Vol. 41, No. 7–9, (1990).

An article by Malherbe et al., titled "Preferential Sputtering of Oxides: A Comparison of Model Predictions With Experimental Data", App. Surface Sci., 27, (1986).

An article by Montero et al., titled "Space Charge and Electret Behaviour in Anodic $Ta_2O_5$ Films", Thin Solid Films, 167, (1988).

An article by Moon et al., titled "Sputter Depth Profiling Analysis of $Ta_2O_5$ on Si Without Prefernetial Sputtering by Energetic Oxygen Beams", App. Phys. Lett. 62, (24) (June 1993).

An article by Murawala et al., titled "Liquid Source CVD Using Penta Ethoxy Tantalum Source", Jap. J. of Vol. 32 (1995).

An article by Murti et al., titled "Structural and Compositional Changes in Ion-Bombarded $Ta_2O_5$", Surface Sci., 81, (1979).

An article by Ohnishi et al., titled "$Ta_2O_5$ Film Formation by Double Ion Beam Method", Nuc. Instrum. and Methods in Phys. Research, B37 (1989).

An article by Kamiyama et al., titled "Ultrathin Tantalum Oxide Capacitor Dielectric Layers Fabricated Using Rapid Thermal Nitridation Prior to Low Pressure Chemical Vapor Deposition", J. Electrochem. Soc. Vol. 140, No. 6 (June 1993).

An article by Zaima titled "Preparation and Properties of $Ta_2O_5$ Films by LPCVD for ULSI Application", J. of the Electrochem Soc., Vol. 37, No. 4 (April 1990).

Significantly, it is to be understood, that no references were found which report piezo-electric properties of $Ta_2O_5$ at temperatures above room temperature, emphasis added. And most significantly, no references, other than recent publications by the Inventors herein, are known which report piezoelectric effects of orthorhombic $Ta_2O_5$.

Even in view of the tremendous amount of literature, a need has thus been identified which has not been addressed.

A piezoelectric sensor and/or actuator which would operate in high temperatures and which could withstand oxidizing, and other refractory environments without undergoing disabling degradation, would provide great utility.

DISCLOSURE OF THE INVENTION

The present invention system comprises a piezoelectric material which demonstrates piezoelectric properties over a large temperature range of from room temperature to approximately one-thousand-three-hundred-sixty (1360) degrees centigrade. Said present invention system is, in the preferred embodiment, sequentially comprised of a first electrically conductive layer, a layer of ($Ta_2O_5$) in other than a monoclinic phase, (eg. orthorhombic), and a second electrically conductive layer. Said present invention system preferably comprises a layer of ($Ta_2O_5$) which is of a depth within a range of less than one micron to approximately ten microns, and in which lateral dimensions provide an area of between approximately one and three millimeters. Said present invention system also provides that present ($Ta_2O_5$) be, preferably, in a relatively stable orthorhombic phase, and that first and second electrically conductive layers can each be made of a material independently selected from the group consisting of: (inconel, iron, steel, tungsten, molybdenum, titanium, tantalum, palladium, chromium and nitrides thereof). While limited in temperature range, aluminum can also be utilized. In addition, it is noted that Niobium might be substituted for Tantalum and a functional piezoelectric system be realized.

A method of fabricating a present invention system which demonstrates piezoelectric properties over a large temperature range, and which present invention system is sequentially comprised of a first electrically conductive layer, a layer of ($Ta_2O_5$) in other than a monoclinic phase, and a second electrically conductive layer, comprising the steps of:

a. providing a first electrically conductive layer;

b. depositing a layer of ($Ta_2O_5$) onto a surface of said first electrically conductive layer; and c. depositing a second electrically conductive layer onto said layer of ($Ta_2O_5$).

Said method of fabricating a present invention system can specifically include sputter depositing said layer of ($Ta_2O_5$) onto a surface of said first electrically conductive layer.

Said method of fabricating a present invention system can further comprise the step of performing an anneal which causes said ($Ta_2O_5$) to present in an orthorhombic phase; said anneal being performed at a point in the method selected from the group consisting of: (after step b but before step c, and after step c). Annealing at eight-hundred (800) and nine-hundred (900) degrees for periods of one (1), ten (10) and sixty (60) minutes has shown beneficial results.

Formation of a present invention system can involve selecting said first electrically conductive layer to be inconel and annealing at nine-hundred degrees centigrade for a period of time of between one minute and one hour, however temperature of eight-hundred degrees or less can suffice.

A slightly modified fabrication procedure comprises the steps of:

a. providing a first electrically conductive layer;

b. depositing a layer of ($Ta_2O_5$) onto a surface of said first electrically conductive layer; and c. sandwiching the resulting system between two electrodes.

Work by the Inventors has shown that orthorhombic ($Ta_2O_5$) belongs to crystallographic class 2 mm, and X-ray Diffraction (XRD) investigation of present invention systems for anneal times of One (1), Ten (10) and Sixty (60) minutes at Eight-Hundred (800) and Nine-Hundred (900) degrees Centigrade, has shown that (0 0 1), (1 10 0) and (1 11 0) crystallographic orientations are formed at Eight-Hundred (800) degrees Centigrade and that longer annealing periods favor the (1 10 0) orientation. Anneal at Nine-Hundred (900) degrees Centigrade provides dominate <1 10 0> and <2 9 0> crystallographic orientations, with pronounced reduced presence of (1 11 0) and (0 0 1) crystallographic orientations. It is noted that the piezoelectric effect observed by the Inventors is significantly greater after anneal at Nine-Hundred (900) degrees Centigrade, and that this result seems to be associated more closely with the absence of <1 11 0> and (0 0 1) crystallographic orientations, than with the presence of enhanced (1 10 0) and (2 9 0) crystallographic orientations. It is further noted that the presence of crystalline structure is correlated with the presence of a strong piezoelectric effect and that annealing at Six-Hundred (600) degrees Centigrade for Fourteen (14) Hours, can provide similar results to annealing for Five (5) Minutes at Nine-Hundred (900) degrees Centigrade. However, the results of annealing at Six-Hundred (600) degrees Centigrade for various time periods has been found to provide a host of results with appearance and disappearance of certain crystal orientations occurring.

A preferred present invention system is packaged in a containment which is stable in refractory atmospheres. This can include forming an electrical contact to at least one of said first and second electrically conductive layers by use of graphite which is caused to physically contact said at least one of said first and second electrically conductive layers, however, simply sandwiching the resulting system between two electrodes has proven to work well. Additionally, a present invention system can be secured against refractory ambient atmospheres by being effectively sealed in protective materials, such as Alumina, Mullite-based adhesive and Silicon-based Geopolymers.

It should be apparent that a method of detecting flex in a physical system would comprise the steps of:

a. providing a piezoelectric system which demonstrates piezoelectric properties over a large temperature range, which piezoelectric system is sequentially comprised of a first electrically conductive layer, a layer of ($Ta_2O_5$) in other than a monoclinic phase, and a second electrically conductive layer, such that when said piezoelectric system is subjected to stress, a voltage appears between said first and second electrically conductive layers;

b. affixing said piezoelectric system to said physical system such that should said physical system flex a voltage appears between said first and second electrically conductive layers; and c. monitoring voltage presenting between said first and second electrically conductive layers.

It should also be apparent that a method of causing flex in a physical system would comprise the steps of:

a. providing a piezoelectric system which demonstrates piezoelectric properties over a large temperature range, which piezoelectric system is sequentially comprised of a first electrically conductive layer, a layer of ($Ta_2O_5$) in other than a monoclinic phase, and a second electrically conductive layer, such that when said piezoelectric system has a voltage applied between said first and second electrically conductive layers, said piezoelectric system flexes;

b. affixing said piezoelectric system to a physical system such that should a voltage be applied between said first and second electrically conductive layers, said physical system is caused to flex; and c. applying voltage presenting between said first and second electrically conductive layers.

In light of said applications of the present invention piezoelectric system, it is noted that physical flex thereof is related to development of voltage between said first and second electrically conductive layers, and that application of a voltage between said first and second electrically conductive layers can cause said piezoelectric system to flex. Thus, said present invention piezoelectric system ideally should demonstrate a high degree of "flexibility". Continuing, particularly where, as in a present invention piezoelectric system, the piezoelectric film is thinner than the electrically conductive layer onto which it is deposited, it is noted that flexural vibrations can be modeled assuming beam geometry. The equation which describes flexural vibrations in a beam is:

$$\lambda_m \frac{\partial^2 u}{\partial t^2} + C_v \frac{\partial u}{\partial t} + C_{kv} I \frac{\partial^5 u}{\partial t \partial x^4} = -D \frac{\partial^4 u}{\partial x^4}$$

where:

D is flexural stiffness, defined as $E_y I$, where $E_y$ is Young's modulus and I is the moment of inertia;
and where:
$\lambda_m$ is the mass per unit length of the beam;
$C_v$ is the viscous damping coefficient; and
$C_{kv}$ the internal damping coefficient.

It is noted that is only negligibly changed by deposition of a film of ($Ta_2O_5$) thereupon, however, this is not true as regards flexural stiffness. A means by which flexural stiffness can be controlled is identified by the beam equation, said means being the control of the Moment of Inertia (I). As a result, the present invention can comprise first conductive layers which are of a variety of shapes, such as essentially tubular and U-shaped. It is noted that, for the purposes of this Disclosure, the terminology "essentially tubular" means that as viewed in side cross-section, said first conductive layer is hollowed-out, and does not imply circular, square or any specific overall shape.

The present invention will be better understood by reference to the Detailed Description Section of this Disclosure, in conjunction with the accompanying Drawings.

SUMMARY OF THE INVENTION

It is therefore a purpose of the present invention to teach a piezoelectric system which demonstrates piezoelectric properties over a large temperature range of from room temperature to approximately 1360 degrees centigrade.

It is another purpose of the present invention to teach a piezoelectric system which is sequentially comprised of a first electrically conductive layer, a layer of ($Ta_2O_5$) in other than a monoclinic phase, (preferably orthorhombic), and a second electrically conductive layer.

It is yet another purpose of the present invention to teach a piezoelectric system which comprises first and second electrically conductive layers which are each, preferably, of a material independently selected from the group consisting of: (inconel, iron, steel, tungsten, molybdenum, titanium, tantalum, palladium, chromium and nitrates thereof), between which first and second electrically conductive layers is present a layer of ($Ta_2O_5$).

It is another purpose yet of the present invention to describe a method of fabricating a piezoelectric system comprising the steps of providing a first electrically conductive layer; depositing a layer of ($Ta_2O_5$) onto a surface of said first electrically conductive layer; depositing a second electrically conductive layer onto said layer of ($Ta_2O_5$); and performing an anneal which causes said ($Ta_2O_5$) to present in an orthorhombic phase.

It is still yet another purpose yet of the present invention to describe use of hollow, tubular and U-shaped electrically conductive means upon which is deposited ($Ta_2O_5$) to provide piezoelectric systems with increased flexibility.

It is another purpose of the present invention to identify the absence of <0 0 1> and (1 11 0> (XRD) spectra peaks as associated with piezoelectric activity in ($Ta_2O_5$).

BRIEF DESCRIPTION OF THE DRAWINGS

FIG. 1a shows an X-ray diffraction plot for a $Ta_2O_5$ film annealed at 800 degrees Centigrade for 1.0 minute.

FIG. 1b shows an X-ray diffraction plot for a $Ta_2O_5$ film annealed at 800 degrees Centigrade for 10.0 minutes.

FIG. 1c shows an X-ray diffraction plot for a $Ta_2O_5$ film annealed at 800 degrees Centigrade for 60.0 minutes.

FIG. 2a shows piezoelectric response plot for the $Ta_2O_5$ film of FIG. 1a.

FIG. 2b shows piezoelectric response plot for the $Ta_2O_5$ film of FIG. 1b.

FIG. 2c shows piezoelectric response plot for the $Ta_2O_5$ film of FIG. 1c.

FIG. 3a shows room temperature piezoelectric ball drop tests of a present invention system comprised of stainless steel upon which was deposited a film of $Ta_2O_5$.

FIG. 3b shows piezoelectric ball drop tests of the present invention system of FIG. 6a after heating and maintaining the temperature thereof at six-hundred-fifty degrees for ninety minutes.

FIG. 3c shows room temperature piezoelectric ball drop tests of a present invention system of FIGS. 6a and 6b after heating and maintaining the temperature thereof at six-hundred-fifty degrees for ninety minutes, and then returning the temperature thereof to room temperature.

FIG. 5 show a demonstrative X-ray diffraction system as utilized in the present invention to determine results shown in FIGS. 1a–1f.

FIG. 6 shows a demonstrative ball drop testing system for testing piezoelectric properties of present invention $Ta_2O_5$ piezoelectric films over a temperature range.

FIG. 7a shows a cross-sectional view of a present invention piezoelectric system formed by deposition of a $Ta_2O_5$ film onto a first conductive layer, said system being placed between two stainless steel electrodes.

FIG. 7b shows a cross-sectional view of a simple present invention piezoelectric system formed by deposition of a $Ta_2O_5$ film onto a first conductive layer, followed by deposition of a second conductive layer atop said deposited $Ta_2O_5$ film.

DETAILED DESCRIPTION

Figure 1D:
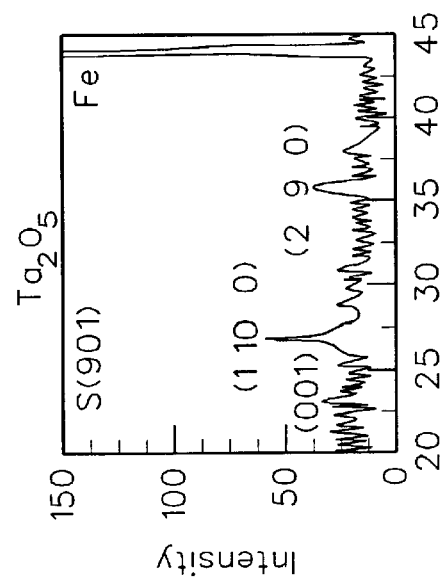
FIG. 1d shows an X-ray diffraction plot for a $Ta_2O_5$ film annealed at 900 degrees Centigrade for 1.0 minute.

Results presented in FIGS. 1a–1f and 2a–2f were obtained by investigation of present invention piezoelectric systems fabricated utilizing polished and chemically cleaned inconel coupons (0.05×10×30 mm) as substrates, upon each of which was sputter deposited a $Ta_2O_5$ film with a thickness of from less than a micron to ten (10) or so microns. In work to date said $Ta_2O_5$ films were sputter deposited in a D.C. magnetron sputtering system, major elements of which are demonstrated in FIG. 4, (discussed supra herein). Said inconel coupons were not heated by an external source during said sputter deposition of $Ta_2O_5$ thereonto, and as-deposited $Ta_2O_5$ films were shown by X-ray diffraction (XRD) analysis to be essentially amorphous, although some nanometer microcrystalline order was present. X-ray diffraction investigation of as-deposited films was carried out in a system as indicated in FIG. 5, (discussed supra herein). It is of interest to note that said amorphous $Ta_2O_5$ films did show some minimal piezoelectric behavior. To increase said piezoelectric activity, Rapid Thermal Annealing (RTA) was performed on said as-deposited $Ta_2O_5$ films by placing them into a small preheated pulsed-current furnace for periods of one (1), ten (10) and sixty (60) minutes. Two furnace temperatures were used, these being eight-hundred (800) and nine-hundred (900) degrees centigrade. Cooling was achieved by removal of the present invention piezoelectric systems from said furnace and letting them cool in room ambient conditions. To test the strength of achieved piezoelectric activity, a simple ball-drop test was performed in a ball-drop system as demonstrated in FIG. 6. Prior to said ball-drop testing, each $Ta_2O_5$ film/inconel coupon system was placed between two small stainless steel plates. (see (SS1) and (SS2) in FIG. 7a), which were physically (1×25× 65 mm) in size, and which stainless steel plates served as electrode contacts. An oscilloscope was utilized to monitor voltage developed when a small ball was dropped onto the resulting system through a repeatability ensuring, impact force guiding tube.

As mentioned, FIGS. 1a–1f and 2a–2f show representative results of tests performed on present invention piezoelectric systems prepared utilizing inconel coupons as just described. In describing said results, a notation S("1" "23") is utilized, where "1" indicates the first number of the anneal temperature utilized, and "23" indicates the time of said anneal in minutes. (Hence S(901) indicates a one (1.0) minute anneal at nine-hundred (900) degrees Centigrade. FIG. 1a shows the results of (XRD) investigation of a $Ta_2O_5$ film sputtered onto inconel and annealed for one (1.0) minute at eight-hundred (800) degrees Centigrade. FIG. 1a indicates an amorphous film with only an iron (Fe) peak resulting from the inconel. FIG. 1b shows an S(810) case, and it is to be noted that major (XRD) peaks at (0 0 1), (1 10 0) and (1 11 0) have formed with minor peaks presenting at (2 9 0) and (1 11 1). The (0 0 1) and (1 10 0) peaks are seen to be dominate. FIG. 1c shows an S(860) case and it should be noted that a strong increase in the peak at (1 10 0), (as compared to the FIG. 1b case), has developed, and that the <2 9 0> peak has also increased, while the <0 0 1> and (1 11 0) peaks have diminished. This indicates that the peak at (1 10 0) has a lower energy state but a slow rate of formation, which is possibly the result of an associated high formation energy.

It is interesting at this point to observe FIGS. 2a, 2b and 2c and realize that they show ball-drop piezoelectric test results for piezoelectric sensor systems containing $Ta_2O_5$ films, the (XRD) crystallographic results for which are shown in FIGS. 1a, 1b and 1c respectively. Note that while some piezoelectric behavior is present, it is limited to tens (10's) of mv.

Figure 1E:
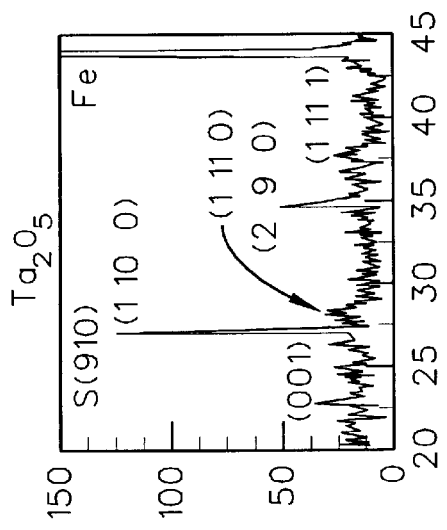
FIG. 1e shows an X-ray diffraction plot for a $Ta_2O_5$ film annealed at 900 degrees Centigrade for 10.0 minutes.
Figure 1F:
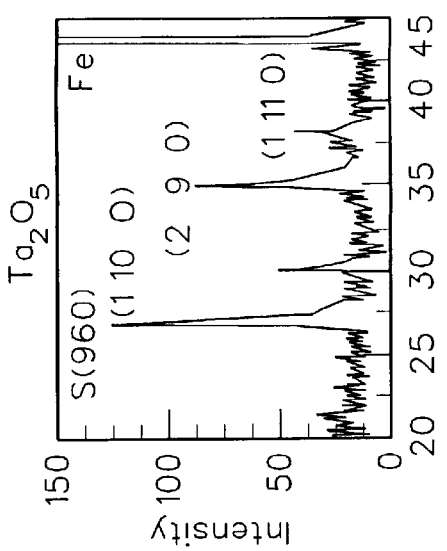
FIG. 1f shows an X-ray diffraction plot for a $Ta_2O_5$ film annealed at 900 degrees Centigrade for 60.0 minutes.

Turning now to FIGS. 1d–1f, there are shown (XRD) results for S(901), S(910) and S(960) cases respectively. That is, FIGS. 1d–1f show (XRD) results for $Ta_2O_5$ films annealed for one (1.0), ten (10) and sixty (60) minutes respectively, at nine-hundred (900) degrees Centigrade. FIG. 1d shows that at nine-hundred (900) degrees Centigrade the (1 10 0) peak formation rate was fast and higher energy of formation peak <0 0 1>, was not prevelant. At longer periods of anneal S(910) and S(960), (see FIGS. 1e and 1f), the <1 10 0> peak became more prominent. It is also noted that as the time of anneal increased, the <2 9 0> peak grows in intensity, and that a third peak at (2θ=29.8) starts to form. An interesting thing to note is that FIGS. 1c and 1e which show S(860) and S(910) anneal crystallography (XRD) results look generally similar, with the exception that the <0 0 1> and <1 11 0> peaks are smaller in the S(910) FIG. 1e case. Note also the near absence of (0 0 1) and (1 11 0) peaks in the S(901) plot shown in FIG. 1d.

Figure 2D:
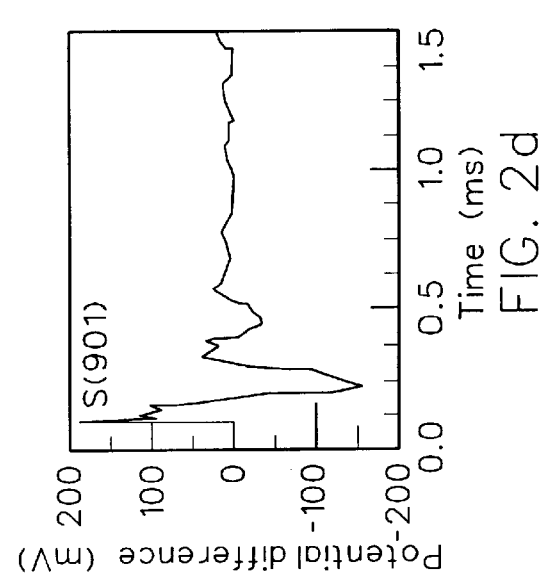
FIG. 2d shows piezoelectric response plot for the $Ta_2O_5$ film of FIG. 1d.
Figure 2E:
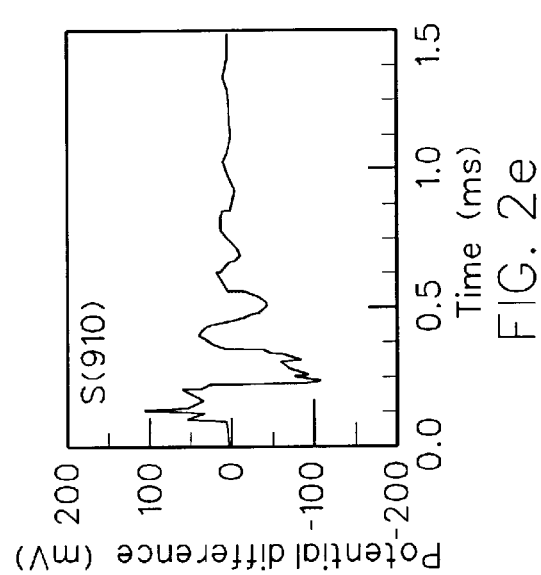
FIG. 2e shows piezoelectric response plot for the $Ta_2O_5$ film of FIG. 1e.
Figure 2F:
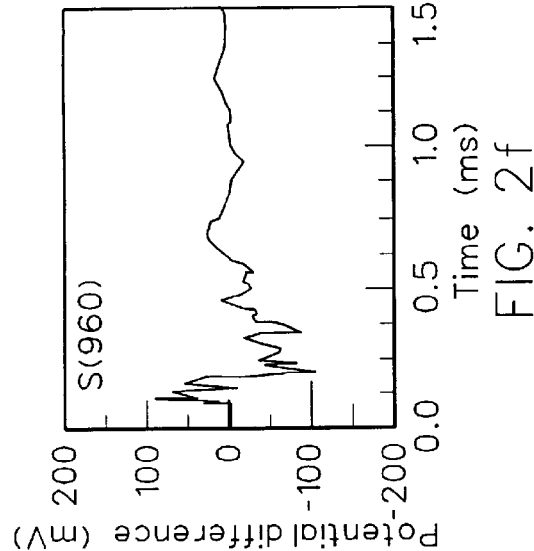
FIG. 2f shows piezoelectric response plot for the $Ta_2O_5$ film of FIG. 1f.

FIGS. 2d–2f show ball drop piezoelectric test results for piezoelectric sensor systems formed on inconel coupons, the crystallographic orientations of which are shown in FIGS. 1d, 1e and 1f respectively. Note that the piezoelectric effect is relatively strong, (eg. hundreds of mv's), and that the largest ball-drop test response is seen in the FIG. 2d results, which correspond to the S(901) case.

Analysis of the results presented in FIGS. 1a–1f and 2a–2f indicates that it is the absence of peaks at (0 0 1) and (1 11 0) which indicates a stronger piezoelectric effect $Ta_2O_5$ film. It is also stated that all (XRD) results are consistent with powder diffraction data for orthorhombic $Ta_2O_5$. The films are polycrystalline and isotropic in the substrate plane.

FIGS. 3a–3c are included to show results of investigation of elevated temperature on operation of present invention piezoelectric systems. The substrate utilized was made of 316L stainless steel with physical dimensions of (112×14.5× 0.89 mm), and a sputter deposited $Ta_2O_5$ film thereon was annealed at seven-hundred (700) degrees Centigrade for sixty seconds, then allowed to cool to room temperature to effect an orthorhombic phase. FIG. 3a shows results of ball-drop tests performed at room temperature. FIG. 3b shows the results of repeating the piezoelectric ball-drop test after heating and maintaining said system at six-hundred-fifty (650) degrees Centigrade. Reference to FIG. 3b shows that the piezoelectric signal is reduced from that shown in FIG. 3a, however, said response is still sufficient to monitor system flex induced by a ball-drop. FIG. 3c shows similarly obtained test results after said system was allowed to cool back to room temperature. It is noted that room temperature ball-drop piezoelectric effect test results shown in FIG. 3c are at least as good, if not better than, result shown in FIG. 3a. The reduced piezoelectric effect seen in FIG. 3b is therefore attributed to softening of the stainless steel at elevated temperature, rather than to any degradation of the $Ta_2O_5$ film.

It is also noted that optical microscope investigation of the $Ta_2O_5$ film after the identified testing indicated no sign of cracking or spalling.

FIG. 7b shows a cross-sectional view of a simple present invention piezoelectric system comprising a first conductive layer (COND1), upon which is deposited a $Ta_2O_5$ film, upon which deposited film of $Ta_2O_5$ is deposited a second electrically conductive layer (COND2). It is noted that actually fabricated present invention piezoelectric systems have first and second electrically conductive layers (COND1) and (COND2) which are many time thicker than the deposited film of $Ta_2O_5$. For instance, a $Ta_2O_5$ film might be a maximum of ten (10) microns thick, and the first (COND1) and second (COND2) electrically conductive layers fifty each be (50) microns thick. FIG. 7a shows a present invention piezoelectric system formed of a first electrically conductive layer (COND1) upon which is deposited a film of $Ta_2O_5$, said system being sandwiched between two stainless steel plates (SS1) and (SS2). It is also noted that said electrically conductive layers can be of solid, hollow or U-shape etc. geometry.

EXPERIMENTAL SYSTEMS

Figure 4:
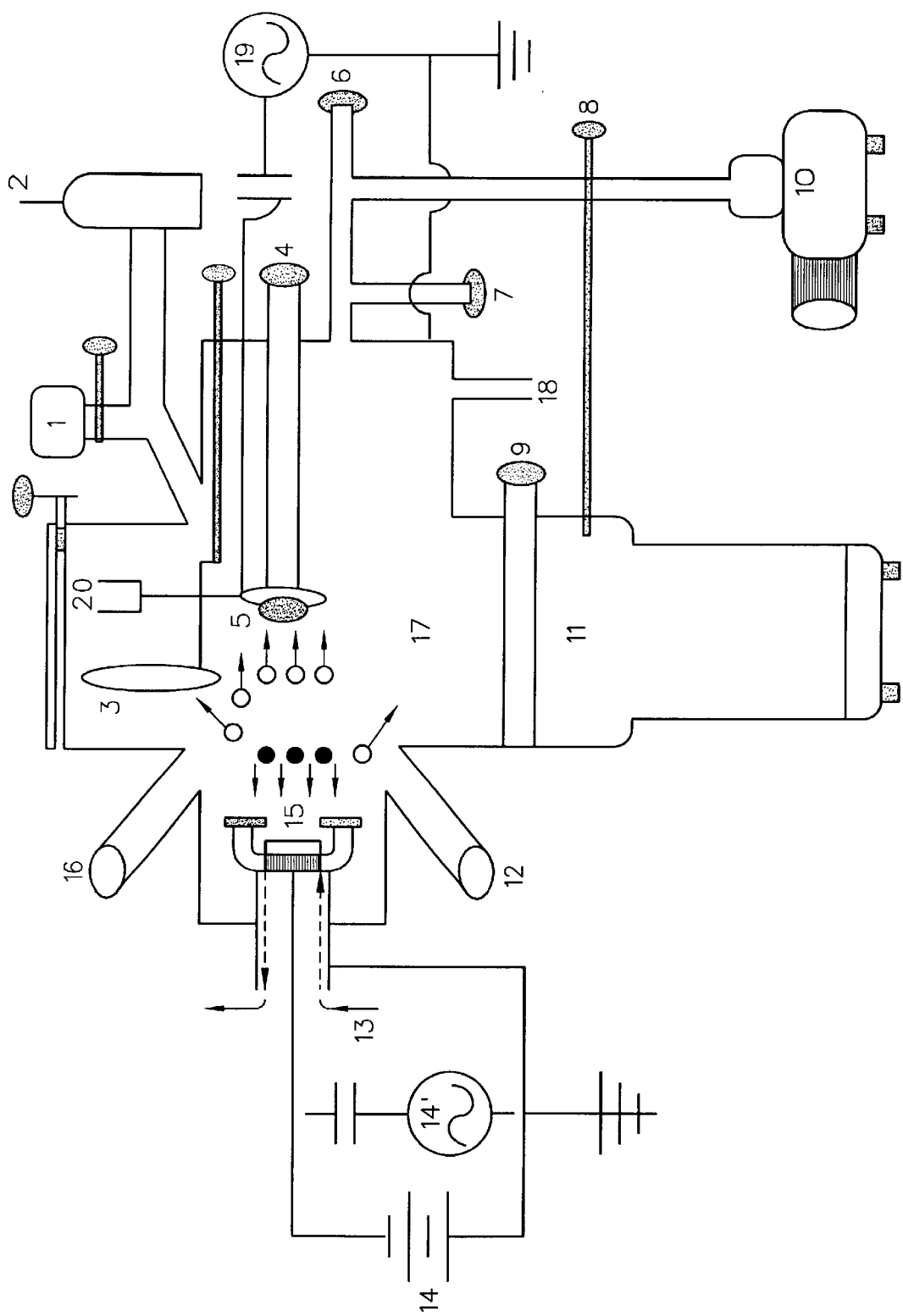
FIG. 4 shows a demonstrative sputter system for depositing $Ta_2O_5$ piezoelectric films such as those of the present invention.

As an aide to understanding, there is shown in FIG. 4 a diagram of a sputtering system which is similar in important respects, to that utilized to sputter deposit present invention piezoelectric $Ta_2O_5$ films. Note in particular that a vacuum chamber (17) is present in which is housed a substrate holder (4), (shown with a substrate (5) affixed thereto). A heater/thermocouple (20) is shown as present, and in use can provide means for controlling and monitoring substrate (5) temperature. Also shown is a shutter (3). By a rotation action, shutter (3) is caused to, in use, alternatingly block and provide access of sputtered atoms to the substrate (5). For instance, it is common practice to do a predeposition sputtering to bring the system into stability, prior to actually depositing target material upon a substrate (5). The shutter (3) enables this procedure. Also shown are a mechanical pump (10) and a mechanical valve (6) which controls access of the mechanical pump to the vacuum chamber (17), and a cryo pump (11), and a gate valve (9) which controls access of the cryo pump (11) to the vacuum chamber. In use the mechanical pump (10) is used to reduce the pressure in the vacuum chamber (17) to approximately ($10^{-3}$ Torr) and the cryo pump is used to then further reduce said pressure to an approximate ($10^{-5}$ Torr) background level prior to the entry of sputtering gas (argon/oxygen). An ion gauge (2) means and a nanometer pressure gage (1) are shown as well. In use these gauges allow measurement of the pressure inside the vacuum chamber (17). Also shown is a Tantalum target (15) positioned in a magnetron (21) configuration. Shown as well are a D.C. (14) power supply, (and an optional alternative R.F (14') power supply), for use in applying electrical power to support a plasma near the target (15). The present invention work was performed utilizing D.C. magnetron excitation, but it is understood such is not a limitation. Note also that an effective ground potential is supported at the substrate (5), but again this is not a limitation of the system. Means for providing cooling water (13) to the magnetron (21) is also indicated. In use, after mechanical (10) and cryo (11) pumps have provided a sufficiently low pressure in the vacuum chamber (17), a gas (eg. argon and oxygen), is entered to the vacuum chamber (17) by way of gas inlet (18). It will be noted that between the magnetron configuration (21)/target (15) and the substrate (5), there are indicated argon and oxygen atoms impinging upon the Tantalum target (15), and Tantalum atoms are shown diffusing to the substrate (5) where they combine with oxygen and deposit as a $Ta_2O_5$ film. (Note that a $Ta_2O_5$ target could optionally be utilized). While not utilized in present work, it is noted that ellipsometry ports (12) and (16) are shown. In use an ellipsometer can provide real time monitoring of film deposition thickness. Finally, a vent (7) is shown which in use allows re-pressurizing the vacuum chamber after use.

Typical present invention fabrication deposition parameters were:

Background pressure ($10^{-5}$) Torr effected by mechanical (10) and cryo (11) pumps.

Sputtering pressure ($10^{-3}$) Torr

Sputtering Deposition Gas Pressures:

Argon 2.85–8.0 mTorr
Oxygen 0.15–2.0 mTorr
$O_2$/Ar Flow Ratio 1:10
Substrate Temperature
Deposition atom bombardment raised temperature to approximately sixty (60) degrees Centigrade. No intentional heating performed.
Sputter Power 16–60 Watts
Current 40–120 MA
Voltage 400–500 Volts (applied by D.C. Magnetron (15)
Target Diameter 2.5 inches
Target Material 99.95 % Pure Tantalum
Spacing Between Target (15) and Substrate (5) 85 MM
Deposition Rate 0.3–1.0 Micron/Hr
Typical Deposition Time 3 Hours Also to aide with understanding, FIG. 5 shows a diagram of an X-ray Diffraction system (XRD) as utilized in investigation of the present invention $Ta_2O_5$ films. FIG. 5 shows the meaning of the (2θ) factor on the abscissa of the plots in FIGS. 1a–1f. In particular note that a source of X-ray electromagnetism (Diffractometer) can be oriented with respect to a sample surface at an a variable angle (θ), and than a detector then intercepts said electromagnetic radiation after it is diffracted by said sample.

FIG. 6 shows a Ball-drop test system with high temperature capability, as utilized in obtaining results presented in FIGS. 2a–2f, and in FIGS. 3a–3c. In particular note that a sample, shown as comprised of a stainless steel beam upon which has been deposited a $Ta_2O_5$ film, (but can also be inconel with a $Ta_2O_5$ film deposited thereonto), is shown secured in position. Electric leads are shown leading to an oscilloscope which monitors electrical voltage developed during a ball-drop test. A drop tube is shown as present which in use serves to guide a weight (eg. a copper ball), onto said steel beam/$Ta_2O_5$ film system in a controlled, repeatable manner. Also shown is a source of heated air, which is positioned to allow controlled heating of the stainless steel beam/$Ta_2O_5$ film system in a controlled, repeatable manner, during ball-drop piezoelectric response testing.

Finally, it is noted that many examples of potential applications for present invention piezoelectric systems were surveyed in the Background Section of this Disclosure. While said examples provide insight as to the scope of application of the present invention, it is to be understood that the present invention can be applied in any setting in which detection of flex or vibration is desire, or in which application of a voltage controlled flex or vibration is desired.

Having hereby disclosed the subject matter of the present invention, it should be apparent that many modifications, substitutions, and variations of the present invention are possible in light thereof. It is to be understood that the present invention can be practiced other than as specifically described and should be limited in scope and breadth only by the appended Claims.

What is claimed is:

1. A piezoelectric system which demonstrates piezoelectric properties over a large temperature range, said piezoelectric system being sequentially comprised of a first electrically conductive means, a layer of $Ta_2O_5$ in other than a monoclinic phase, and a second electrically conductive means, such that when said piezoelectric system is subjected to stress a voltage appears between said first and second electrically conductive means, and such that when a voltage is applied between said first and second electrically conductive means said piezoelectric system is caused to flex.

2. A piezoelectric system as in claim 1 in which said $Ta_2O_5$ is orthorhombic phase and said large temperature range is from room temperature to approximately 1360 degrees centigrade.

3. A piezoelectric system as in claim 1 in which said layer of $Ta_2O_5$ is of a depth within a range of less than one micron to approximately ten microns, and in which lateral dimensions thereof provide an area of between approximately one and three square millimeters, and in which said first and second electrically conductive means are each thicker than said layer of $Ta_2O_5$.

4. A piezoelectric system as in claim 1 in which said first and second electrically conductive means are of a material each independently selected from the group consisting of:

inconel;

iron;

steel;

tungsten;

molybdenum;

titanium;

tantalum;

palladium;

chromium; and nitrides thereof.

5. A piezoelectric system as in claim 1 in which said first electrically conductive means is steel and in which said piezoelectric system is annealed at nine-hundred degrees centigrade for a period of time of between one minute and one hour.

6. A piezoelectric system as in claim 1 in which said first electrically conductive means is inconel and in which said piezoelectric system is annealed at nine-hundred degrees centigrade for a period of time of between one minute and one hour.

7. A piezoelectric system as in claim 1 which is packaged in a containment which is stable in refractory atmospheres.

8. A piezoelectric system as in claim 7 in which said containment is comprised of at least one selection from the group consisting of:

alumina;

mullite-based adhesive; and silicon-based geopolymer.

9. A piezoelectric system as in claim 1 in which the first electrically conductive means is of a side cross-sectional shape selected from the group consisting of:

solid rectangular;

hollow rectangular;

hollow tubular; and

U-shaped.

10. A piezoelectric system which demonstrates piezoelectric properties over a large temperature range, said piezoelectric system being sequentially comprised of a first electrically conductive means, a layer of $Ta_2O_5$, and a second electrically conductive means, said $Ta_2O_5$ in said layer thereof demonstrating an essential absence of x-ray crystallography (0 0 1) and (1 11 0) peaks.

* * * * *